United States Patent
Pelley (10) Patent No.: US 7,669,100 B2
(45) Date of Patent: Feb. 23, 2010

(54) SYSTEM AND METHOD FOR TESTING AND PROVIDING AN INTEGRATED CIRCUIT HAVING MULTIPLE MODULES OR SUBMODULES

(75) Inventor: Perry H. Pelley, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 236 days.

(21) Appl. No.: 11/683,607

(22) Filed: Mar. 8, 2007

(65) Prior Publication Data

US 2008/0220545 A1  Sep. 11, 2008

(51) Int. Cl.
 *G01R 31/3193* (2006.01)
 *G01R 31/40* (2006.01)

(52) U.S. Cl. .................. 714/732; 714/715

(58) Field of Classification Search .......... None
 See application file for complete search history.

(56) References Cited

U.S. PATENT DOCUMENTS

| | | | | |
|---|---|---|---|---|
| 4,264,782 A * | 4/1981 | Konheim | ............. | 705/75 |
| 4,503,537 A * | 3/1985 | McAnney | ............. | 714/728 |
| 4,918,693 A * | 4/1990 | Ardini et al. | ............. | 714/25 |
| 5,761,145 A * | 6/1998 | Zagar et al. | ............. | 365/226 |
| 5,778,006 A * | 7/1998 | Mukai et al. | ............. | 714/733 |
| 5,930,182 A * | 7/1999 | Lee | ............. | 365/194 |
| 6,115,763 A | 9/2000 | Douskey et al. | ............. | 710/72 |
| 6,128,756 A | 10/2000 | Beffa | ............. | 714/718 |
| 6,311,302 B1 | 10/2001 | Cassetti et al. | ............. | 714/727 |
| 6,334,198 B1 | 12/2001 | Adusumilli et al. | ............. | 714/727 |
| 6,385,749 B1 | 5/2002 | Adusumilli et al. | ............. | 714/733 |
| 6,686,759 B1 | 2/2004 | Swamy | ............. | 324/765 |
| 6,895,479 B2 | 5/2005 | Reimer et al. | ............. | 711/152 |
| 6,907,548 B2 | 6/2005 | Abdo | ............. | 714/43 |
| 7,071,833 B2 * | 7/2006 | Nagano et al. | ............. | 340/635 |

(Continued)

FOREIGN PATENT DOCUMENTS

JP       64-026175       1/1989

(Continued)

OTHER PUBLICATIONS

McNairy, C. et al.; "Montecito: A Dual-Core, Dual-Thread Itanium Processor"; IEEE Micro; 2005; pp. 10-20; IEEE Computer Society.

(Continued)

*Primary Examiner*—Kevin L Ellis
*Assistant Examiner*—Dipakkumar Gandhi
(74) *Attorney, Agent, or Firm*—Robert L. King; Susan C. Hill (57) ABSTRACT

In an integrated circuit having a plurality of modules and/or submodules that each performs a substantially same function, defective modules and/or submodules are determined by creating a test signature from an input test pattern. The output of each module and/or submodule is compared with the test signature and defective modules to identify defective modules and/or submodules. The identity of defective modules/submodules is stored on the integrated circuit for subsequent use by a customer. Integrated circuits having one or more defective modules/submodules are sold to customers with full disclosure of which modules/submodules are defective, thereby improving the yield associated with the product. Pricing of the product is discounted for products with less than full functionality.

20 Claims, 4 Drawing Sheets

U.S. PATENT DOCUMENTS

| | | | |
|---|---|---|---|
| 2001/0035766 A1 | 11/2001 | Nakajima | 324/765 |
| 2002/0175697 A1 | 11/2002 | Miller et al. | 324/765 |
| 2003/0088380 A1* | 5/2003 | Sakaguchi | 702/118 |
| 2006/0233312 A1* | 10/2006 | Adams et al. | 379/21 |

FOREIGN PATENT DOCUMENTS

| | | |
|---|---|---|
| KR | 10-2001-0065333 A | 7/2001 |

OTHER PUBLICATIONS

Mayer, A. et al.; "Debug Support, Calibration and Emulation for Multiple Processor and Powertrain Control SoCs"; Proceedings of the Design, Automation and Test in Europe Conference and Exhibition; 2005; 5 pp; IEEE Computer Society.

Larsson, A. et al.; Buffer and Controller Minimisation for Time-Constrained Testing of System-On-Chip; Proceedings of the 18th IEEE International Symposium on Defect and Fault Tolerance in VLSI Systems; 2003; IEEE Computer Society.

International Search Report and Written Opinion.

\* cited by examiner

SYSTEM AND METHOD FOR TESTING AND PROVIDING AN INTEGRATED CIRCUIT HAVING MULTIPLE MODULES OR SUBMODULES

BACKGROUND

1. Field

This disclosure relates generally to semiconductors, and more specifically, to the testing and sale of semiconductors.

2. Related Art

As integrated circuits evolve and incorporate significantly more amounts of circuitry, the ability to reliably manufacture large percentages of fully functional integrated circuit products on a single semiconductor wafer has become very difficult. The yield of good die that exists on a wafer therefore is often lower for a complex integrated circuit and a low yield results in a significant amount of lost revenue for a manufacturer.

To improve yield results, others have incorporated redundant circuitry onto an integrated circuit. The redundant circuitry is selectively used after an integrated circuit is tested to replace identified defective circuitry. However, as large amounts of circuitry have been incorporated into an integrated circuit the amount of redundancy required to insure that failing circuitry can be replaced is often cost and size prohibitive. As a result the yields of complex integrated circuits are often much lower than desired.

As integrated circuits advance in function and complexity, multiple data processors have been incorporated onto a single integrated circuit. When such integrated circuits are tested, each of the data processors within the integrated circuit is typically serially tested in an assigned order. Disadvantages with known testing methodologies include the increased time to test complex integrated circuits and the high cost associated with the electronic testers which determine the functionality of the integrated circuit. Test equipment to perform diagnostic testing for complex integrated circuits typically costs in excess of one million U.S. dollars and thus represents a significant investment for an integrated circuit manufacturer. To reduce test time, others have tested multiple processors in parallel. In such test methodologies, a comparison between the outputs of the multiple processors is made to indicate whether all of the processors are providing the same result or a different result. When a different result is indicated a failure of the circuitry is noted by the test equipment.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
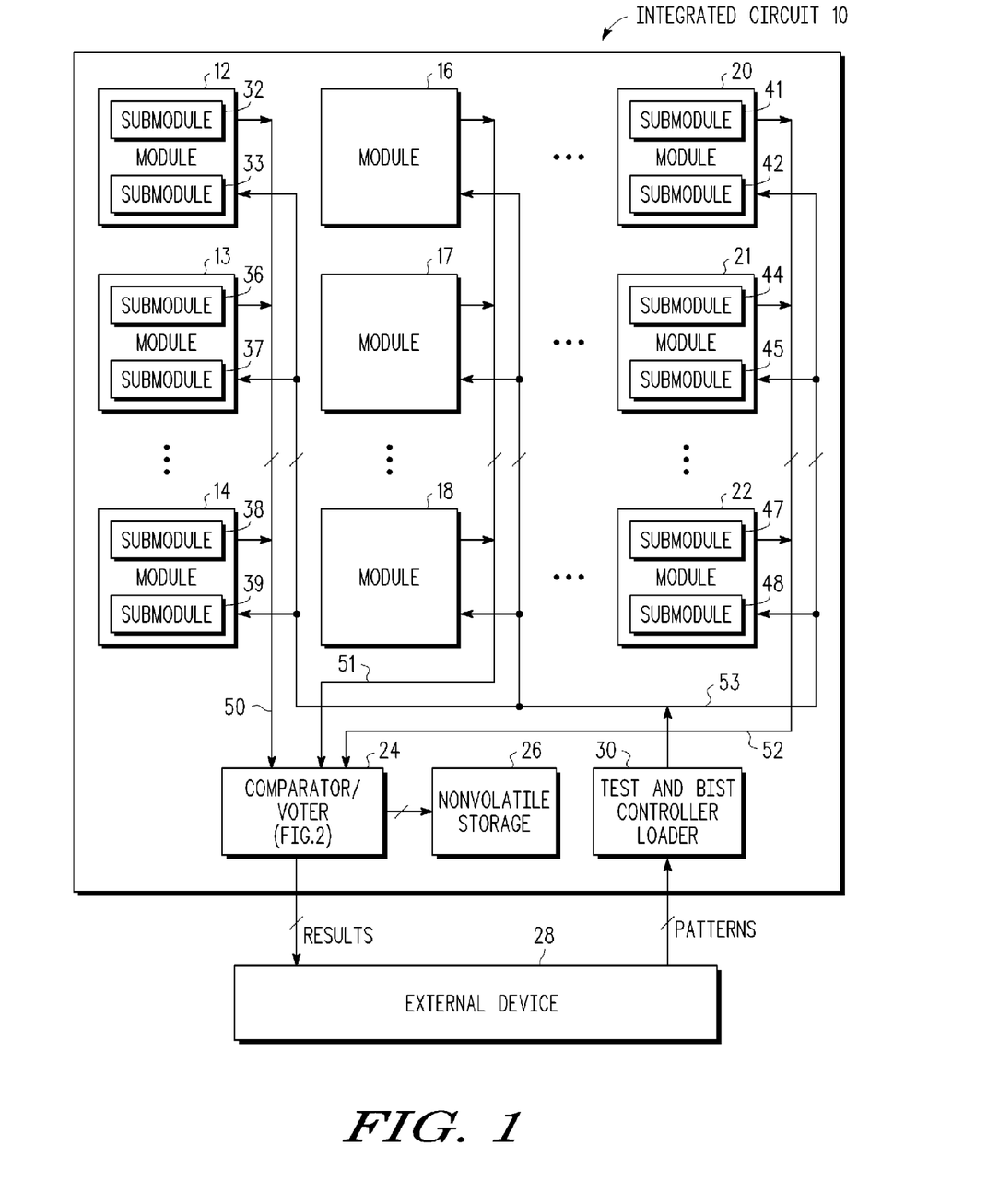
FIG. 1 illustrates in block diagram form an integrated circuit having multiple modules in accordance with one form of the present invention.

Illustrated in FIG. 1 is an integrated circuit 10 having a plurality of circuit modules such as modules 12. It should be understood that integrated circuit 10 as represented in FIG. 1 is only one of numerous circuit architectures that may be implemented. For convenience of illustration, various circuitry within the integrated circuit 10 which is unrelated to test features of integrated circuit 10 is not detailed. The integrated circuit 10 has a plurality of modules such as modules 12, 13, 14, 16, 17, 18, 20, 21 and 22. The modules are illustrated as being arranged in rows and columns but it should be understood that such uniformity is not required. Also additional modules may be present as indicated by the three dots present in each column and row of the modules. For example, in one form sixty-four modules may be present but it should be well understood that any number of modules may be used. Within some of the modules are a plurality of additional modules or submodules. For example, module 12 has a submodule 32 and a submodule 33. Module 13 has a submodule 36 and a submodule 37. Module 14 has a submodule 38 and a submodule 39. Module 20 has a submodule 41 and a submodule 42. Module 21 has a submodule 44 and a submodule 45. Module 22 has a submodule 47 and a submodule 48. Each of modules 12-14 has an output connected to a test output bus 50. Each of modules 16-18 has an output connected to a test output bus 51. Each of modules 20-22 has an output connected to a test output bus 52. It should be understood that in another form a single common test output bus may be used rather than three separate buses. Each of modules 12-14, 16-18 and 20-22 has an input connected to a test input bus 53. A comparator/voter circuit 24 has first, second and third inputs respectively connected to the test output bus 50, the test output bus 51 and the test output bus 52. A first output of the comparator/voter circuit 24 is connected via a multiple conductor bus to an input of an external device 28 for providing Results information regarding the outcome of the comparing and voting functions performed by the comparator/voter circuit 24. A second output of the comparator/voter circuit 24 is connected to an input of a nonvolatile storage device 26. The external device 28 has an output for providing via a multiple conductor bus test Patterns to an input of a test and BIST (built-in self-test) controller loader 30. The test and BIST controller loader 30 has an output connected to the test input bus 53.

In operation, integrated circuit 10 has multiple modules. In one form the modules implement the same function. For example each module may be a data processor or a core which is capable of executing the same instruction set. In other forms each module may be another type of circuit such as a memory, a converter or a state machine. In yet other forms only portions of the modules are the same. For example the modules 12-14 in the first column may be floating point processing units, whereas the modules 16-18 in the second column may be fixed point processing units. Additionally, each or most of the modules in integrated circuit 10 may be different types of circuits. Within one or more of the modules is a plurality of identical or substantially identical submodules. It should be understood that the submodules may be checked or tested for functionality within a single module in the same manner that the following discussion describes the testing of same-function modules within integrated circuit 10. Therefore, when the terms "module" and "submodule" are used herein, each of these terms may be more generally be identified as a "circuit".

For purposes of explanation assume that the modules 12-14, 16-18 and 20-22 implement the same functions and thus should produce the same result when provided the same inputs. The external device 28 provides specific test patterns to the test and BIST controller loader 30 which receives and stores the test patterns. The test patterns are routed under the control of control circuitry (not shown) to each of the modules for execution of a predetermined test function by all of the modules on the test patterns. As an example of a test pattern, two operands may be provided in the test pattern in addition to a command to multiply the two operands in each of the modules. Each of the modules performs one or more test operations contained in the test pattern and generates a result referred to as an "actual test signature" that is communicated via the test output buses 50-52 to the comparator/voter circuit 24. The comparator/voter circuit 24 functions to examine each of the outputs from the modules and determine on a bit-by-bit basis what binary value has resulted. This determination is made by polling each module on a bit-by-bit basis and allowing each module to "vote" for the correct test signature bit. A simple majority vote wins or determines what binary value is recognized as the correct bit value for all bits of the test signature. In the event that a split vote occurs, a default bit value is consistently used. The existence of a split vote indicates that half of the modules are generating diverging values and this indicates an error margin of at least fifty percent which is too great for the integrated circuit to be commercially viable. Therefore, the value of the default bit is not critical. When the comparator/voter circuit 24 has created the correct test signature from the voting function and compared that signature with each signature generated by the modules, the results of the test are stored in the nonvolatile storage device 26. The test results provide good/bad information for each module indicating whether a module is good or bad. The nonvolatile storage device 26 may be any type of NVM device. The nonvolatile storage device 26 is preferably nonvolatile so that the test results remain for subsequent use by a user of the integrated circuit or for subsequent checking from outside of the integrated circuit 10. For example, the good/bad information of each module can be used subsequently for instruction flow thread assignment in which any indicated bad modules are prevented from being accessed in the instruction flow. It again should be mentioned that the testing can be applied to multiple submodules of a single module in integrated circuit wherein the details provided herein apply equally.

It should be noted that in one form the external device 28 is a tester in the form of a personal computer which keeps statistics regarding the results from the comparator/voter circuit 24. An advantage associated with the testing of integrated circuit 10 is that a conventional personal computer is readily capable of performing the analysis and data processing required to implement the testing of integrated circuit 10. Therefore, a complex and expensive tester is not required to determine full functionality of integrated circuit 10. It should also be understood that the BIST portion of the test and BIST controller loader 30 may independently generate test patterns that are coupled to the test input bus 53. In one form the BIST portion of the test and BIST controller loader 30 is run at power-up of the integrated circuit.

When the external device 28 receives the results, it will be easily determinable how many of the modules (or submodules) within integrated circuit 10 are good and how many are bad. Depending upon how many are good, integrated circuit 10 can be placed into a product category for sale based upon what percentage of the multiple modules is good. Because integrated circuit 10 has a substantial number of repetitive modules, the product will still have commercial value even when there are some bad (i.e. incorrectly operating) modules. There are numerous applications for example when a large number of processors are provided that use of the product is valuable even when not all of the processors are operating correctly. As long as the incorrectly operating processor or processors is identified so that it will not be used, many viable applications exist for the less-than-fully functional integrated circuit.

Figure 2:
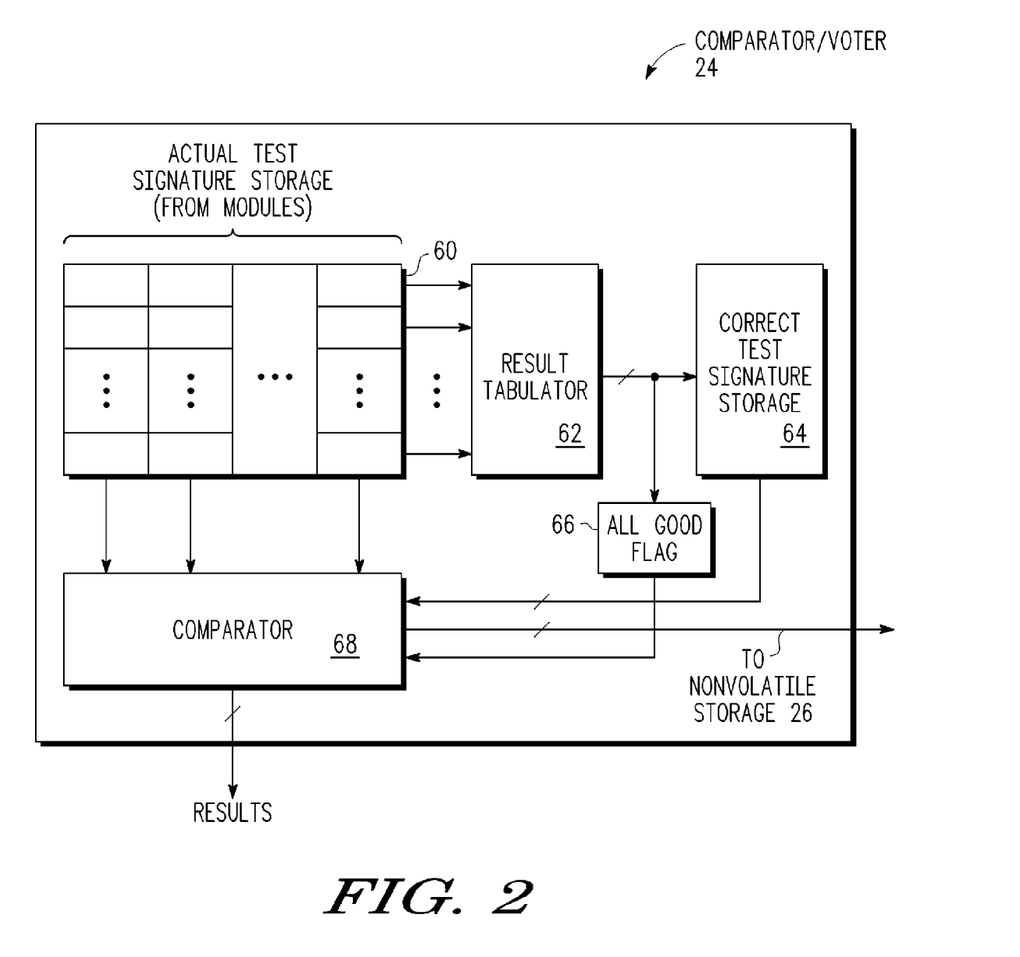
FIG. 2 illustrates in block diagram form a compare and voting circuit in the integrated circuit of FIG. 1.

Illustrated in FIG. 2 is a block diagram of one form of the comparator/voter circuit 24 of FIG. 1. A storage device 60 is provided for receiving actual test signatures from each of the modules that are being tested in parallel. Each test signature represents an output result of a predetermined functional operation using the patterns provided by the external device 28. The storage device 60 is structurally organized to readily correlate a stored actual test signature with a respective module. It should again be understood that test signatures from submodules of a single module may be received and stored rather than receiving and storing test signatures from multiple modules. The storage device 60 has multiple outputs that are connected to respective inputs of a result tabulator 62. The result tabulator 62 has an output connected to both an input of a correct test signature storage 64 and to an input of an All Good Flag storage device 66. An output of the correct test signature storage 64 is connected to a first control input of a comparator 68. An output of the All Good Flag storage device 66 is connected to a second control input of the comparator 68. Comparator 68 has multiple inputs, each of which is connected to a predetermined output of the storage device 60. Comparator 68 has a first output for providing Results connected to the external device 28 and a second output connected to nonvolatile storage device 26 as mentioned above for also providing the Results for storage within the integrated circuit 10. It should be understood that the Results information provided by the first output and the second output of the comparator 68 may be in differing formats while still containing the same information regarding what modules (submodules) provided good information and what modules (submodules) provided bad information.

In operation, the result tabulator 62 is implemented by logic circuitry and determines which logic value (one or zero) is the most prevalent for each bit of the actual test signatures created by all of the modules (or submodules) under test. Therefore the result tabulator 62 functions to count or tabulate how many logic ones and how many logic zeros at each position of the actual test signatures exist. A simple majority is typically used to determine which bit value is used to form a correct test signature. The correct test signature will therefore function as the "golden master" signature which will subsequently be used by comparator 68 to compare each actual test signature with. The output of comparator 68 indicates which of the actual test signatures differ from the generated correct test signature. In the event that the result tabulator 62 determines that all respective bit values of the actual test signatures match, a bit value or flag is set to so indicate in the All Good Flag storage device 66. When the All Good Flag is asserted, comparator 68 is disabled from comparing the actual test signatures and the correct test signatures and directly indicates in the Results that all the test signatures are good information. This bypass operation speeds up the test operation and reduces power that would otherwise be consumed by comparator 68. Thus the comparator/voter circuit 24 efficiently uses the results from input test data and creates a correct test signature that is used to individually compare the output from each module or submodule being tested.

Figure 3:
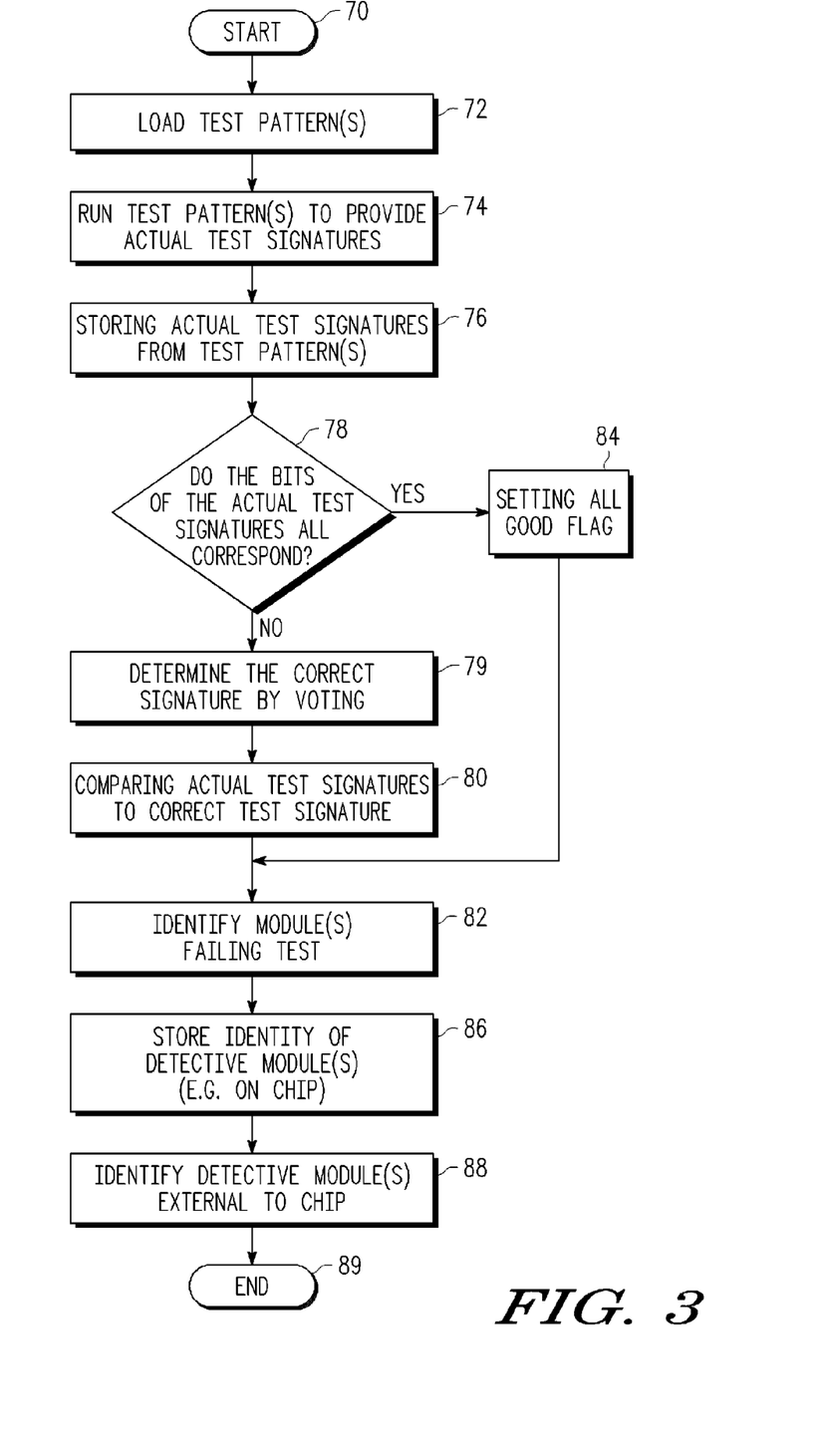
FIG. 3 illustrates in flow chart form a method for testing the integrated circuit of FIG. 1.

Illustrated in FIG. 3 is a flow chart of a method for providing integrated circuit 10 of FIG. 1. In a step 70 the method is initiated with a start command. In a step 72 one or more predetermined test patterns are loaded into the test and BIST controller loader 30. In a step 74 one or more test patterns are run by making the modules or submodules execute the test patterns to provide actual test signatures. In a step 76 the actual test signatures created from running the one or more test patterns are stored in the storage device 60. In a step 78 a comparison is made to determine if the bits of the actual test signatures all correspond. If all bits of the test results are not the same, the correct test signature is determined in a step 79 by voting as described above. A step 80 is executed in which the actual test signatures are compared with the correct test signature that was determined in step 79. Upon completion of step 80 any results of modules or submodules which differ from the correct signature are identified as failing the test in a step 82. If all bits of the test results are the same, a step 84 is executed in which the All Good flag of the All Good flag storage device 66 is set and step 80 is bypassed. In this situation step 82 will provide a 'good information' indicator for all modules/submodules and not identify any module/submodule as failing the test. After step 82 the identity of any defective module or submodule is stored in nonvolatile storage device 26 on the integrated circuit 10 in a step 86. After step 86 the identity of any defective (i.e. bad) modules or submodules is provided external to the integrated circuit 10 in a step 88 wherein the method concludes with step 89.

Figure 4:
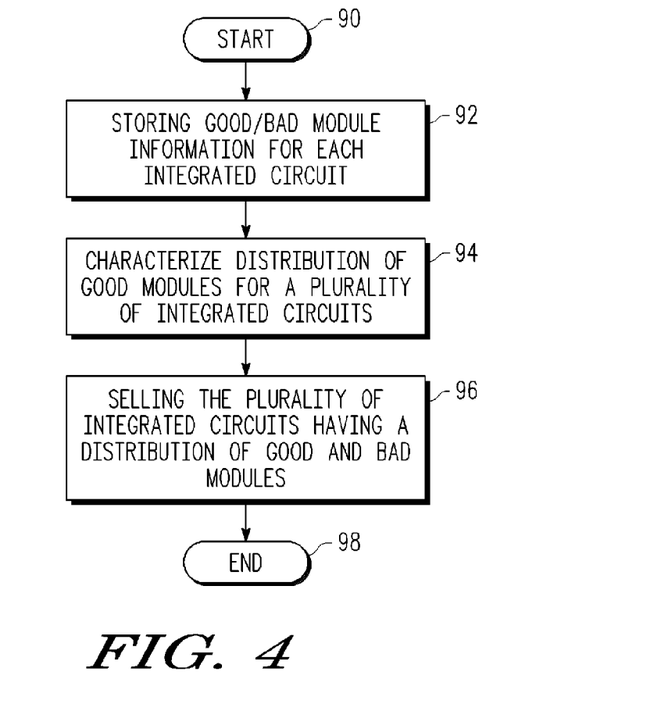
FIG. 4 illustrates in flow chart form a method for providing the integrated circuit of FIG. 1 after testing is performed.

Illustrated in FIG. 4 is a method for using the testing described above. The method begins with a step 90. In a step 92 good module/submodule and bad module/submodule information is stored for each of the modules or submodules that have been tested. In a subsequent step 94 the distribution of good modules is characterized for a plurality of integrated circuits to determine a cumulative yield for the plurality of integrated circuits. In other words, the number of good modules with no defective modules or submodules is determined. The number of good modules with one defective module, two defective modules, etc is then determined. In a step 96 the plurality of integrated circuits is sold based upon a disclosed distribution of good and bad modules in the integrated circuits. For example a determination is made whether a particular integrated circuit is useful in an application when three defective modules out of sixty-four modules exist. For those applications, the integrated circuits are sold with a full disclosure of the number of defective modules and the integrated circuit has stored therein the identity of which modules are defective. The distribution of bad circuits within the integrated circuit being sold is provided to a customer for their use in applying the integrated circuit into their design. It should be understood that the sale of the integrated circuits includes money transactions, the trade of in-kind product, the transfer of technology and know-how for the integrated circuits and other forms of compensation. As a result a user of the integrated circuit will be able to program and use the integrated circuit by avoiding errors which would be caused by the bad modules. Completion of a commercial transaction involving of the integrated circuit ends the method at step 98.

Figure 5:
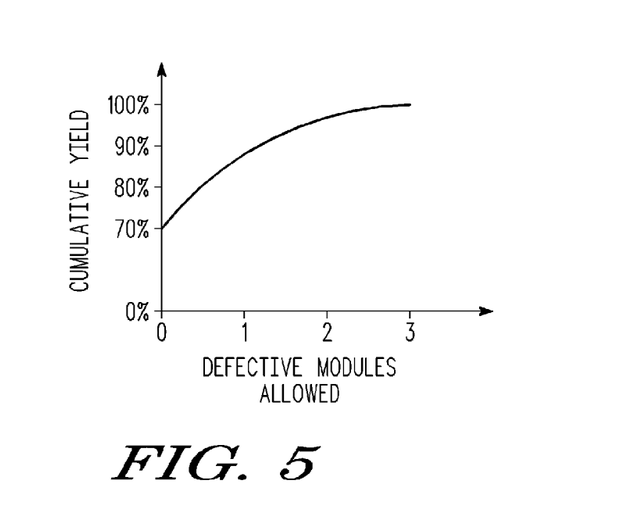
FIG. 5 illustrates in graphical form a relationship between product yield and detected defects of the integrated circuit of FIG. 1.

Illustrated in FIG. 5 is a graph that illustrates how the cumulative yield of an integrated circuit increases as the number of allowed defective modules increases. Conventionally, one defective module results in a non-commercial product. However, by using the methods described herein when the defective module is identified for a user to avoid, the product is useful and the yield increases over just using products having no defective modules. Similarly, if there is a sufficiently large number of modules, the number of defective modules that may be permitted is greater. By commercially using all of these products the yield is increased and more profit is realized. At some point a maximum number of defective modules that may be permitted is reached and the realized yield levels off. The actual values of the cumulative yield is dependent upon the total number of modules or submodules that are implemented.

By now it should be appreciated that there has been provided test methods and structures that significantly improve the test features and yields of integrated circuits. Multiple modules or submodules on an integrated circuit that perform substantially the same functions are tested in parallel with one or more test patterns. Results from each of the modules or submodules are tested to find any disagreement and a valid signature result is created with bits which represent the majority digital value for each bit position. Any failing modules or submodules are identified by comparing the actual signature of each module with the valid signature result. The identity of the failing modules or submodules is stored on the integrated circuit which is sold with a disclosure to a customer of which modules and submodules are not functional. Yield of the integrated circuit production is thereby improved. The methods described herein reduce the test costs associated with multiple core processors and other integrated circuits having multiple circuit modules. The identity of failing modules may be made by indicating addresses of a failed core. The addresses of failing modules may be used to blow fuses that indicate what modules failed rather than using a nonvolatile memory such a nonvolatile storage device 26. Alternatively, the failing addresses may be used to write to a register or to write to a memory an entry indicating the address of a failed module.

Although the invention has been described with respect to specific conductivity types or polarity of potentials, skilled artisans appreciated that conductivity types and polarities of potentials may be reversed. Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, the type of circuit represented by the modules and submodules may be processor cores, standard logic, state machines, memories, and numerous other electronic circuits. The total number of modules and submodules may be very large and is not limited to any particular number. Various modifications may be made to identify the faulty modules other than the examples provided herein. For example, displays or other optical indicators may be used. The test patterns which may be used are not limited to any particular type of test methodology. It should be understood that all circuitry described herein may be implemented either in silicon or another semiconductor material or alternatively by software code representation of silicon or another semiconductor material. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

In one form there is provided a method in which first good/bad information is provided for a first circuit on an integrated circuit. Second good/bad information is provided for a second circuit on the integrated circuit. Third good/bad information is provided for a third circuit on the integrated circuit. The first, second, and third circuits each output a same test result in response to a same test input when good. The integrated circuit is provided for sale when at least one of the first, second, or third good/bad information indicates that at least one of the first, second, or third circuits remains bad and is unrepaired. In another form the first good/bad information is stored in a nonvolatile storage circuit on the integrated circuit. In another form pricing of the integrated circuit is a function of a number of good circuits on the integrated circuit. In yet another form the integrated circuit is a first price if all of the first, second, and third circuits are good. The integrated circuit is a second price if at least one of the first, second, or third circuits remain bad wherein the first price is higher than the second price. In another form the first good/bad information is used for the first circuit to determine if the first circuit should not be used during operation of the integrated circuit. In another form a distribution of bad circuits is determined across a plurality of integrated circuits. In yet another form the distribution of bad circuits is provided to a purchaser of the integrated circuit. In one form a voting operation is performed on a result of at least one test to determine whether each circuit is good/bad.

In another form a method includes testing a plurality of circuits on the integrated circuit. A test output is provided from each of the plurality of circuits. If any of the test outputs differ, a voting operation is performed to determine which of the plurality of circuits are bad. In one form the voting includes determining which test output is a most correct test output. Each of the plurality of circuits having the most correct test output is presumed to be good. In another form good/bad information for the plurality of circuits is stored in nonvolatile storage circuitry on the integrated circuit. In another form the nonvolatile storage circuitry is a fuse. In another form the nonvolatile storage circuitry includes a plurality of fuses, wherein each of the plurality of fuses corresponds to one of the plurality of circuits.

In another form an integrated circuit includes a first circuit which provides a first test signature in response to a test. A second circuit provides a second test signature in response to the test. A third circuit provides a third test signature in response to the test. A voting circuit compares the first, second, and third test signatures and determines a most correct test signature. A comparator compares each of the first, second, and third test signatures to the most correct test signature to determine good/bad information for each of the first, second, and third circuits. In another form nonvolatile storage circuitry stores the good/bad information for each of the first, second, and third circuits. In yet another form a flag is provided for indicating that all of the first, second, and third circuits are good. In yet another form storage circuitry stores the first, second, and third test signatures. In another form test circuitry provides an input test pattern to the first, second, and third circuits during the test. In another form the first, second, and third circuits are a same-type data processor. In one form the first circuit is a first submodule, the second circuit is a second submodule, and the third circuit is a third submodule.

The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method, comprising:
   providing first good/bad information for a first circuit on an integrated circuit;
   providing second good/bad information for a second circuit on the integrated circuit;
   providing third good/bad information for a third circuit on the integrated circuit,
   wherein the first circuit, second circuit, and third circuit each outputs a same test result in response to a same test input when good, and good/bad information is determined by examining test output from each of the first circuit, the second circuit and the third circuit on a bit-by-bit basis and voting to determine what binary value is recognized as a correct bit value for each respective bit to provide a correct test signature before comparing the correct test signature with each test output; and
   providing the integrated circuit for sale when at least one of the first good/bad information, second good/bad information, or third good/bad information indicates that at least one of the first circuit, second circuit, or third circuit remains bad for not being functional and is unrepaired.

2. A method as in claim 1, wherein the first good/bad information is stored in a nonvolatile storage circuit on the integrated circuit.

3. A method as in claim 1, wherein pricing of the integrated circuit is a function of a number of good circuits on the integrated circuit.

4. A method as in claim 1, wherein the integrated circuit is a first price if all of the first, second, and third circuits are good, wherein the integrated circuit is a second price if at least one of the first circuit, second circuit, or third circuit remains bad, and wherein the first price is higher than the second price.

5. A method as in claim 1, further comprising:
   using the first good/bad information for the first circuit to determine if the first circuit should not be used during operation of the integrated circuit.

6. A method as in claim 1, further comprising:
   determining a distribution of bad circuits across a plurality of integrated circuits.

7. A method as in claim 6, further comprising:
   providing the distribution of bad circuits to a purchaser of the integrated circuit for using in applying the integrated circuit into a design of the purchaser.

8. A method as in claim 1, further comprising:
   voting to determine what binary value is recognized as the correct bit value for each respective bit to provide the correct test signature by using a majority vote to determine the binary value that is recognized as the correct bit value and using a default bit value when a split vote occurs.

9. A method, comprising:
   testing a plurality of circuits on an integrated circuit;
   providing a test output from each of the plurality of circuits;

examining each test output on a bit-by-bit basis and voting to determine what binary value is recognized as a correct bit value for each respective bit of a correct test signature; and comparing the correct test signature with each test output to determine which of the plurality of circuits are bad.

10. A method as in claim 9, wherein said voting further comprises:
determining the correct test signature by a majority vote to determine the binary value that is recognized as the correct bit value and using a default bit value when a split vote occurs.

11. A method as in claim 9, further comprising:
storing, in nonvolatile storage circuitry on the integrated circuit, good/bad information for the plurality of circuits.

12. A method as in claim 11, wherein the nonvolatile storage circuitry comprises a fuse.

13. A method as in claim 11, wherein the nonvolatile storage circuitry comprises a plurality of fuses, wherein each of the plurality of fuses corresponds to one of the plurality of circuits.

14. An integrated circuit, comprising:
a first circuit which provides a first test signature in response to a test;
a second circuit which provides a second test signature in response to the test;
a third circuit which provides a third test signature in response to the test;
a voting circuit which compares respective bits of the first, second, and third test signatures and uses a majority vote to determine what binary value is recognized as a correct bit value for each respective bit of a most correct test signature; and
a comparator which compares each of the first, second, and third test signatures to the most correct test signature to determine good/bad information for each of the first, second, and third circuits.

15. An integrated circuit as in claim 14, further comprising:
nonvolatile storage circuitry which stores the good/bad information for each of the first, second, and third circuits.

16. An integrated circuit as in claim 14, further comprising:
a flag which indicates that all of the first, second, and third circuits are good.

17. An integrated circuit as in claim 14, further comprising:
storage circuitry for storing the first, second, and third test signatures.

18. An integrated circuit as in claim 14, further comprising:
test circuitry for providing an input test pattern to the first, second, and third circuits during the test.

19. An integrated circuit as in claim 14, wherein the first, second, and third circuits are a same-type data processor.

20. An integrated circuit as in claim 14, wherein the first circuit comprises a first submodule, wherein the second circuit comprises a second submodule, and wherein the third circuit comprises a third submodule.

* * * * *